United States Patent
Nemirovsky et al.

(10) Patent No.: US 9,733,128 B2
(45) Date of Patent: Aug. 15, 2017

(54) SENSOR ARRAY WITH SELF-ALIGNED OPTICAL CAVITIES

(71) Applicants: Technion Research and Development Foundation Ltd., Haifa (IL); A.B. Todos Imaging 2012 Ltd., Herzliya (IL)

(72) Inventors: Yael Nemirovsky, Haifa (IL); Yoav Shoham, Caesarea (IL)

(73) Assignee: TODOS TECHNOLOGIES LTD., Airport (IL)

(*) Notice: Subject to any disclaimer, the term of this patent is extended or adjusted under 35 U.S.C. 154(b) by 0 days.

(21) Appl. No.: 14/726,536

(22) Filed: May 31, 2015

(65) Prior Publication Data

US 2015/0372162 A1    Dec. 24, 2015

Related U.S. Application Data

(60) Provisional application No. 62/013,589, filed on Jun. 18, 2014.

(51) Int. Cl.
| | |
|---|---|
| *H01L 31/0232* | (2014.01) |
| *H01L 27/144* | (2006.01) |
| *G01J 5/04* | (2006.01) |
| *H01L 27/146* | (2006.01) |
| *G01J 5/02* | (2006.01) |

(52) U.S. Cl.
CPC ............... *G01J 5/045* (2013.01); *G01J 5/024* (2013.01); *H01L 27/14625* (2013.01); *H01L 27/14649* (2013.01); *H01L 31/02327* (2013.01)

(58) Field of Classification Search
None
See application file for complete search history.

(56) References Cited

U.S. PATENT DOCUMENTS

| | | |
|---|---|---|
| 7,489,024 B2 | 2/2009 | Socher et al. |
| 7,554,085 B2 | 6/2009 | Lee |
| 2009/0114819 A1 | 5/2009 | Yamanaka et al. |
| 2010/0230595 A1 | 9/2010 | Uchida et al. |

OTHER PUBLICATIONS

International Application # PCT/IB2015/054126 Search Report dated Sep. 24, 2015.

*Primary Examiner* — Johannes P Mondt
(74) *Attorney, Agent, or Firm* — Reches Patents

(57) ABSTRACT

A sensing device includes an array of sensing elements. Each sensing element includes a thermal infrared sensor, configured to output an electric signal in response to an intensity of infrared radiation that is incident on the sensor. An individual reflector is formed integrally with the sensor at a location separated from the sensor by one quarter wave at a selected wavelength of the infrared radiation.

14 Claims, 4 Drawing Sheets

SENSOR ARRAY WITH SELF-ALIGNED OPTICAL CAVITIES

CROSS-REFERENCE TO RELATED APPLICATION

This application claims the benefit of U.S. Provisional Patent Application 62/013,589, filed Jun. 18, 2014, which is incorporated herein by reference.

FIELD OF THE INVENTION

The present invention relates generally to radiation sensing, and particularly to sensor arrays for detection and imaging of thermal infrared (IR) radiation.

BACKGROUND

U.S. Pat. No. 7,489,024, whose disclosure is incorporated herein by reference, describes an array of uncooled infrared sensors based on a micro-machined temperature-sensitive MOS transistor. The sensor array can be fabricated using a commercial CMOS process on silicon-on-insulator (SOI) wafers, followed by backside silicon dry etching for each sensor pixel. Sensors produced by the techniques described in this patent are referred to as "thermally-isolated metal oxide semiconductor" (TMOS) devices.

SUMMARY

Embodiments of the present invention that are described herein provide improved thermal sensing devices and methods for producing such devices.

There is therefore provided, in accordance with an embodiment of the invention, a sensing device, including an array of sensing elements. Each sensing element includes a thermal infrared sensor, configured to output an electric signal in response to an intensity of infrared radiation that is incident on the sensor, and an individual reflector, formed integrally with the sensor at a location separated from the sensor by one quarter wave at a selected wavelength of the infrared radiation.

In some embodiments, the sensing element contains an open optical cavity between the sensor and the individual reflector. The individual reflector may be perforated by a matrix of through-holes.

In other embodiments, the sensing element includes one or more dielectric layers, which are deposited over the sensor, and the individual reflector includes a metal layer that is deposited over the one or more dielectric layers, thereby defining a dielectric optical cavity between the sensor and the individual reflector.

In a disclosed embodiment, at least some of the sensing elements include multiple individual reflectors, which are separated from the sensor by one quarter wave at multiple different, respective wavelengths.

In some embodiments, the device includes a blind sensing element, which senses only its own temperature and not the infrared radiation that is incident on the device. In one of these embodiments, the blind sensing element includes a further thermal infrared sensor and a reflecting layer formed less than one quarter wave from the further thermal infrared sensor at the selected wavelength.

Typically, the array includes multiple dielectric and metal layers formed on a semiconductor substrate, wherein at least one of the metal layers is configured to serve as the individual reflector for each of the sensing elements in the array.

In a disclosed embodiment, the thermal infrared sensor in each sensing element includes a micro-machined temperature-sensitive transistor, such as a thermally-isolated metal oxide semiconductor (TMOS) sensor.

Additionally or alternatively, the dielectric and metal layers are further formed so as to define columns between the sensing elements, wherein the columns maintain optical and thermal separation between the sensing elements.

There is also provided, in accordance with an embodiment of the invention, a method for producing a sensing device, including fabricating an array of sensing elements on a semiconductor substrate. Each sensing element includes a thermal infrared sensor, configured to output an electric signal in response to an intensity of infrared radiation that is incident on the sensor, and an individual reflector, formed integrally with the sensor at a location separated from the sensor by one quarter wave at a selected wavelength of the infrared radiation.

The present invention will be more fully understood from the following detailed description of the embodiments thereof, taken together with the drawings in which:

DETAILED DESCRIPTION OF EMBODIMENTS

To enhance sensitivity and wavelength selectivity, infrared sensing arrays may include an integral optical cavity, tuned for the wavelength of interest, for example 9-10 μm for thermal imaging of human subjects. The cavity is formed by placing a reflector one quarter wavelength ($\lambda/4$) behind the sensors in the array. (The reflector is "behind" the sensor array in the sense that the reflector is placed on the side of the array that is opposite the side on which the radiation to be sensed is actually incident. In terms of fabrication, on the other hand, the reflector is typically placed over the front side of the sensor chip, while the radiation is incident on the back side.)

The reflector may be formed as an extended metal layer, which is deposited on a cap wafer that is then bonded to the wafer on which the sensor array is formed, so that the reflector is positioned at the appropriate distance ($\lambda/4$) from the sensors themselves. In experiments with this configuration, however, the inventors found that because of the machining and thinning of the wafer on which the sensor array is formed, the array tends to warp in the center.

Consequently, the distance between the sensors and the reflector varies substantially over the area of the array, resulting in substantial variations in the optical cavity length.

Embodiments of the present invention that are described herein overcome this limitation by attaching an individual optical cavity to each sensor in an array. Instead of adding a separate reflector for all (or a large group) of the sensors, the individual reflectors are typically created by using the metal and dielectric layers that are deposited integrally on the sensor chip as part of the wafer fabrication process. The individual cavities in this case may be open (i.e., they may contain vacuum or air between the sensing element and the reflecting layer), or they may contain dielectric material that is transparent to the IR wavelengths of interest.

Because the cavities are fixed to the individual sensors, the desired cavity dimensions are maintained even in the face of warping of the array as a whole. As a result, coupling of the incoming IR radiation to the sensors is enhanced. Furthermore, the use of individual reflectors, as opposed to a single, common reflector for multiple sensors, reduces crosstalk between neighboring sensors and thus enhances the resolution of the array. Although the embodiments that are described herein refer specifically to TMOS sensor designs, the principles of the present invention may similarly be applied to other types of IR sensor arrays.

Figure 1:
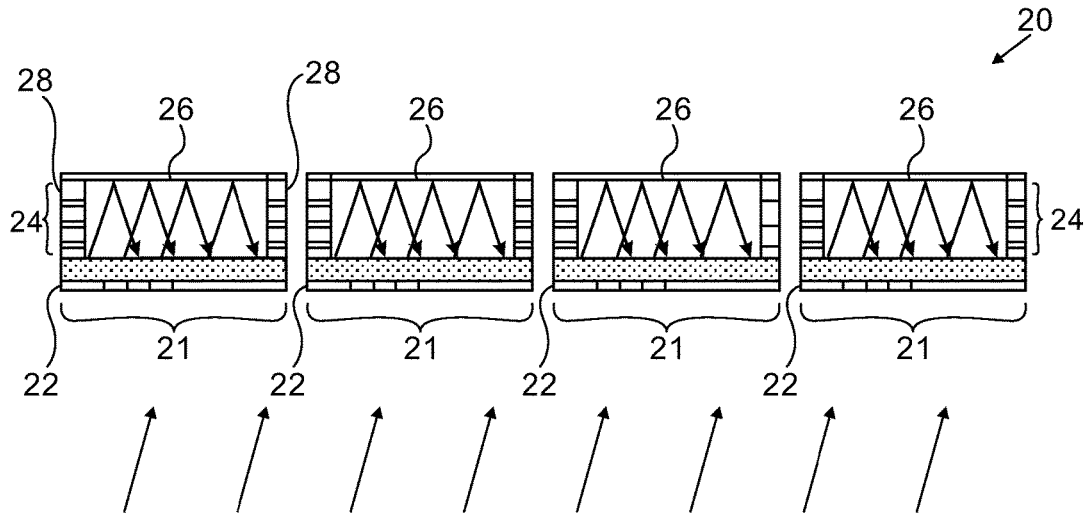
FIG. 1 is a conceptual sectional view of an IR sensor array, in accordance with an embodiment of the present invention.

FIG. 1 is a conceptual sectional view of an IR sensor array 20, in accordance with an embodiment of the present invention. The array comprises multiple sensing elements 21, each comprising a sensor 22, such as a TMOS sensor, and an individual optical cavity 24. Although this sectional view shows only a part of a single row of sensing elements, in practice the sensing elements are typically arranged in a two-dimensional matrix array, with supporting structures that connect them to the surrounding substrate, as described, for example, in the above-mentioned patent. These structures are omitted here for the sake of simplicity.

Figure 3:
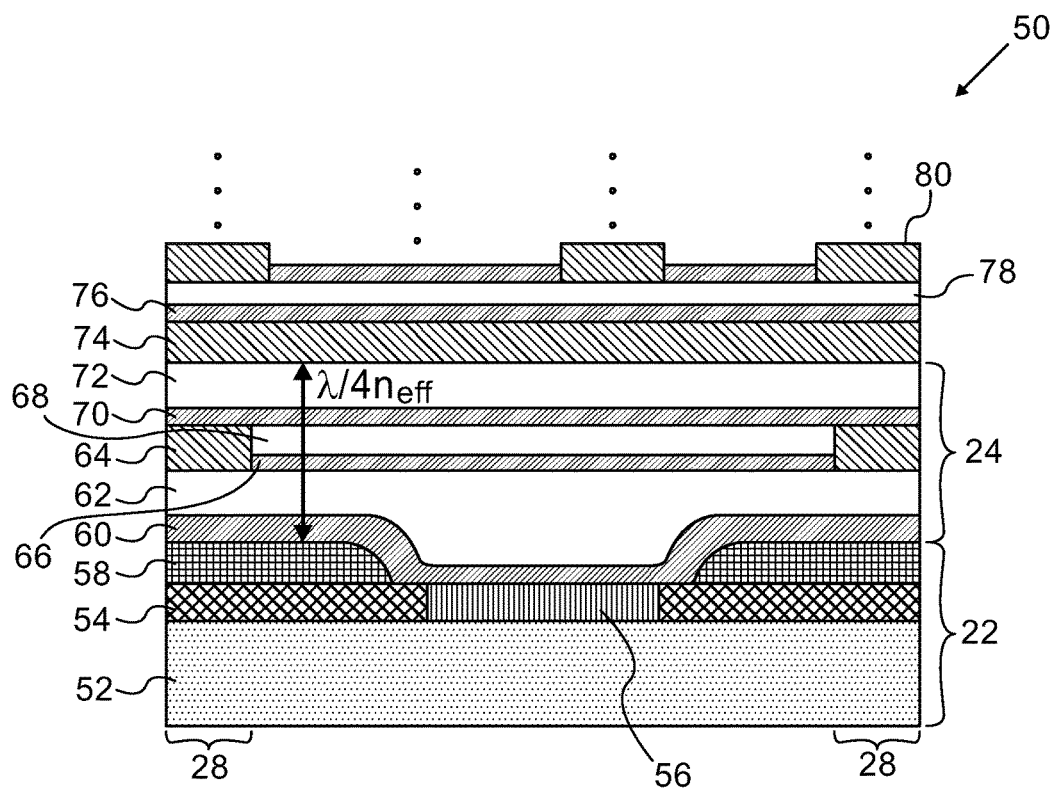
FIG. 3 is a schematic sectional view of a sensing element, in accordance with another embodiment of the invention.
Figure 4:
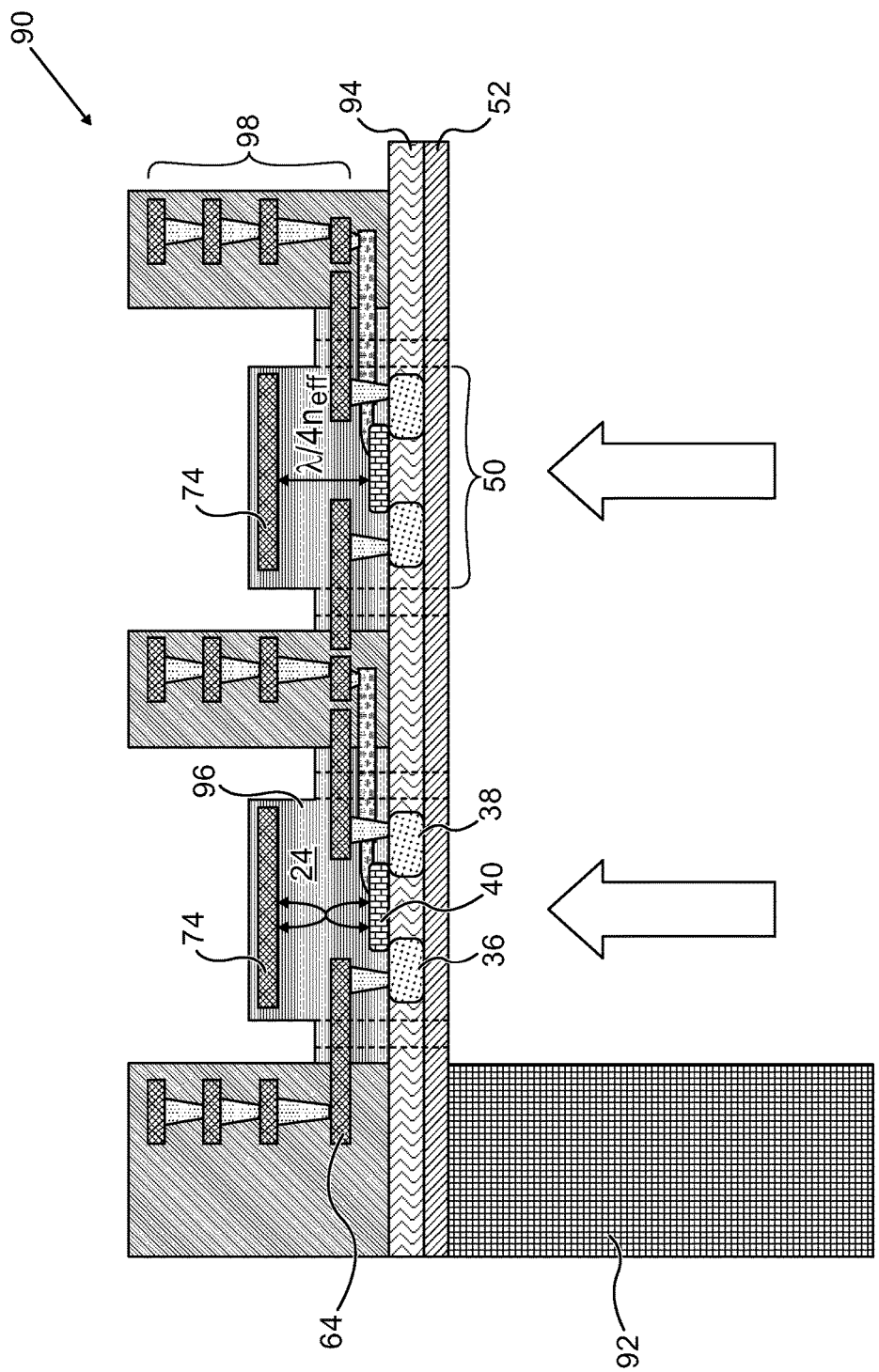
FIG. 4 is a schematic sectional view of an array of sensing elements, in accordance with an embodiment of the present invention.

Cavities 24 are formed by reflectors 26, which are held by support structures 28 at a distance of λ/4 from sensors 22. As a result, when radiation is incident on the array, as illustrated by the arrows coming up from the bottom of the figure, the portion of the radiation that is not absorbed in sensors 22 passes through cavities 24, reflects back from reflectors 26, and nulls the incident radiation at the sensor surface. Reflectors 26 are held in place by "columns" 28, comprising metal and possibly dielectric layers, which are deposited on the sensor wafer as a part of the fabrication process. Cavities 24 in this example are shown as open spaces, but the cavities may alternatively contain dielectric material, as illustrated in FIGS. 3 and 4.

Figure 2A:
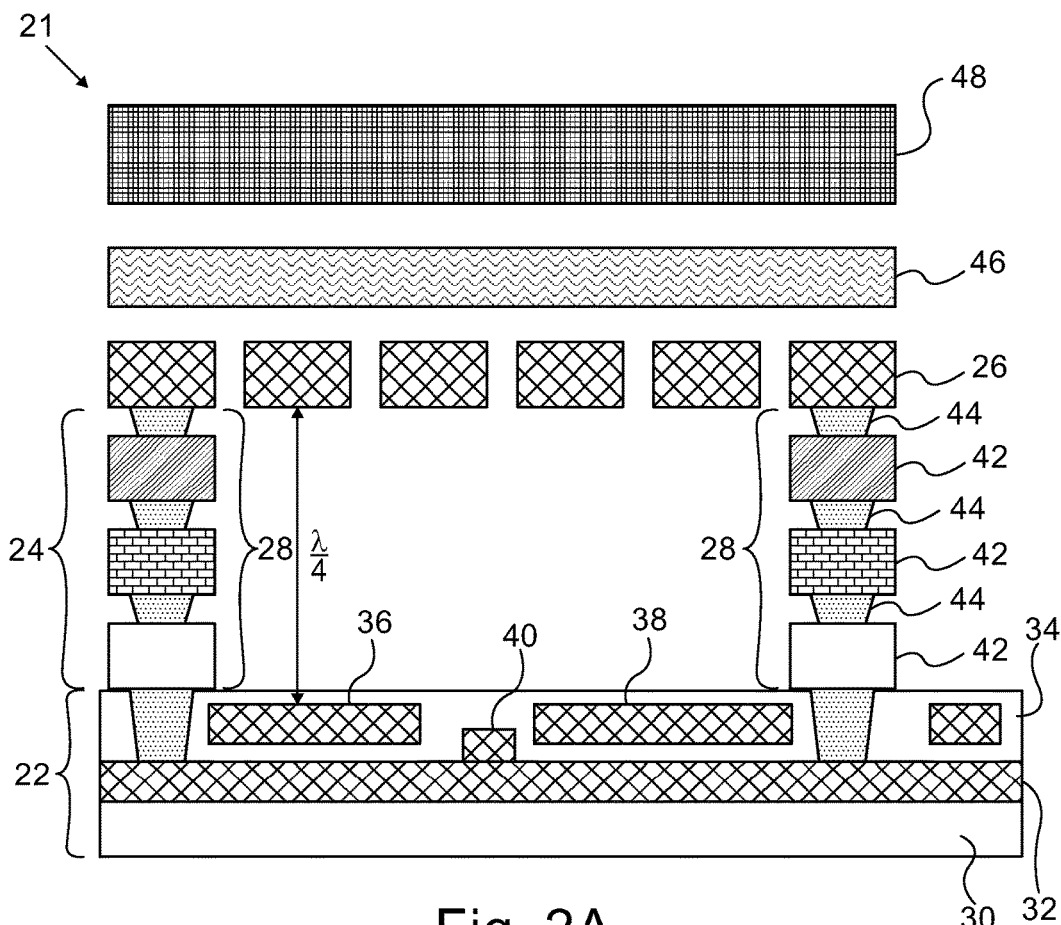
FIG. 2A is a schematic sectional view of a sensing element, in accordance with an embodiment of the present invention.
Figure 2B:
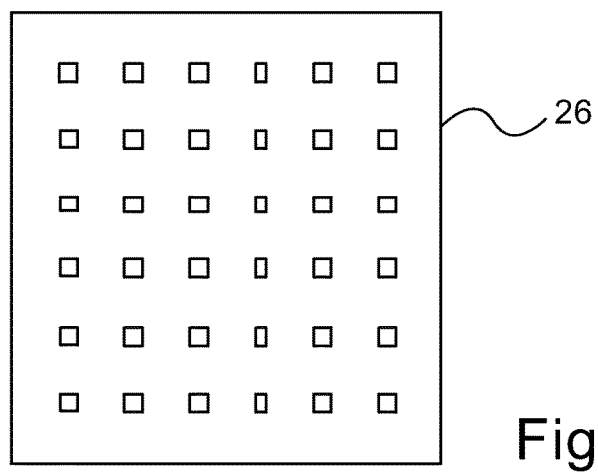
FIG. 2B is a schematic top view of a reflector used in a sensing element, in accordance with an embodiment of the invention.

FIGS. 2A and 2B schematically show details of the structure of sensing elements 21, in accordance with an embodiment of the present invention. FIG. 2A is a sectional view, while FIG. 2B is a top view of reflector 26. In this example, sensor 22 is formed from a silicon-on-insulator (SOI) wafer, with the silicon base wafer etched off the back side to reveal a buried oxide (BOX) layer 30. The sensor itself comprises a silicon wafer layer 32, with a polysilicon layer 34 deposited over the wafer and doped to define a source 36, a drain 38, and a gate 40 of the TMOS transistor. Typically, the area of each sensing element is on the order of 45×45 μm (and these are the dimensions of the reflector shown in FIG. 2B), but larger or smaller sensing elements may similarly be produced in this manner.

Reflector 26 is supported at a distance of λ/4 from the TMOS transistor by columns 28, which comprise a stack of metal layers 42 and interconnecting vias 44. In this case, λ/4 is roughly 2.5 μm, since cavity 24 is under vacuum or filled with air. The layers and vias in columns 28 are formed by the deposition steps that are applied in depositing and etching successive metal and dielectric layers over wafer layer 32. These same metal layers 42 (comprising copper, for example) are typically also used for making connections to source 36, drain 38, and gate 40 of the transistors and other elements of the sensor array device. Reflector 26 is likewise formed from one of these metal layers, for example, the fourth metal layer (M4), which is dedicated and shaped for use as the individual cavity reflectors, rather than for electrical connections. Additional metal layers 46, 48 may overlie reflector 28.

In the pictured example, reflector 26 is perforated by a matrix of through-holes. These through-holes, whose width is substantially less than λ/4, are etching holes, which are used in removing the dielectric material from cavity 24 in order to give the desired, overall optical path length of λ/4 between the transistor and reflector 26.

FIG. 3 is a schematic sectional view of a sensing element 50 in a TMOS sensor array, in accordance with another embodiment of the present invention. In this embodiment, cavity 24 contains dielectric material, so that the radiation wavelength in the cavity is effectively shorter (by 1/n, wherein n is the effective refractive index at the radiation wavelength). Therefore, the cavity is simpler to fabricate and more stable than an open cavity, and it may be made physically shorter than the open cavity of the preceding embodiments.

Sensing element 50 comprises a BOX layer 52, overlaid by a silicon wafer 56 with a polysilicon layer 58 containing the source and drain of the sensor transistor, separated from the BOX layer by shallow-trench isolation (STI) 54. A silicon nitride layer 60 is deposited over the transistor components, followed by a pre-metal dielectric (PMD) layer 62. A first metal layer 64 (M1) is deposited over PMD layer 62, with vias (not shown in the figure) connecting it to the source, drain and gate of the transistor in layer 58. Layer 64 may be formed using a Damascene process, for example, by depositing a silicon nitride layer 66 followed by an interlayer dielectric (ILD) 68, and then etching trenches and filling them with copper. These layers are overlaid with another silicon nitride layer 70 and ILD 72, followed by a further metal layer 74 (M2), which serves as the cavity reflector. Additional nitride layers 76, ILD 78 and metal layers 80 may be formed over or alongside cavity 24.

Cavity 24 in sensing element 50 extends between polysilicon layer 58 and metal layer 74. The effective dielectric constant $\epsilon_{eff}$ of the cavity, at the relevant wavelength (9 μm in this example), can be computed using the individual thicknesses and respective dielectric indices of the layers in the cavity, as illustrated in the following table:

| Layer | Thickness (nm) | ϵ | Weight |
|---|---|---|---|
| Nitride | 50 | 7 | 350 |
| PMD | 360 | 4.2 | 1512 |
| Nitride | 40 | 8.1 | 324 |
| ILD | 220 | 3.7 | 814 |
| Nitride | 40 | 8.1 | 324 |
| ILD | 360 | 3.7 | 1332 |
| Sum | 1070 | | 4650 |

Based on this table, the effective dielectric constant $\epsilon_{eff}$ of the entire cavity is 4650/1070=4.351. The effective refractive index $n_{eff}$ of cavity 24 is equal to the square root of $\epsilon_{eff}$, i.e., $n_{eff}=2.09$. Therefore, the effective thickness of the cavity is 2.09×1.070 μm≅2.25 μm, i.e., λ/4 at 9 μm. The layer thicknesses may be adjusted in similar fashion to give substantially any desired effective cavity thickness for any target wavelength.

Since metal layer 74 serves as a reflector, it is generally not available for connection of the circuit elements in the sensor array. Layer 80 (M3) and higher metal layers may be used for this purpose. The addition of dielectric and metal layers over each sensor in the manner shown in FIG. 3 increases the thermal mass, and hence the response time, of the sensing elements, but the sensor array may be designed to minimize this effect, as shown in the next figure.

FIG. 4 is a schematic sectional view of an array 90 of sensing elements 50, in accordance with an embodiment of the present invention. BOX layer 52, on which sensing elements 50 are formed, is supported by a part of a silicon substrate 92 that remains after etching away the original SOI support wafer. Source 36 and drain 38, which are formed in a polysilicon layer 94, are connected by vias to respective conductors in metal layer 64, as is gate 40. Sensing elements 50 comprise dielectric cavities 96 with an effective thickness of λ/4 between the transistor and the individual reflector that is formed by metal layer 74 in each sensing element. Additional metal layers are contained in columns 98, which serve to maintain the optical and thermal separation between adjacent sensing elements.

Optionally, the sensor arrays described above may include a "blind sensor," which senses only its own temperature and not the scene background, and can thus be used as an indicator of sensor array temperature for purposes of background subtraction. There are several approaches to making a sensor "blind":

1. A sensor that "sees" a mirror (not a cavity) is blind since it sees only "itself".

2. A sensor with the "wrong" cavity will be blind since it will not absorb radiation of the target wavelength.

3. A sensor covered with a mirrors (in the direction of the incoming flux), which completely reflect the incoming radiation, will similarly be blind.

Figure 5:
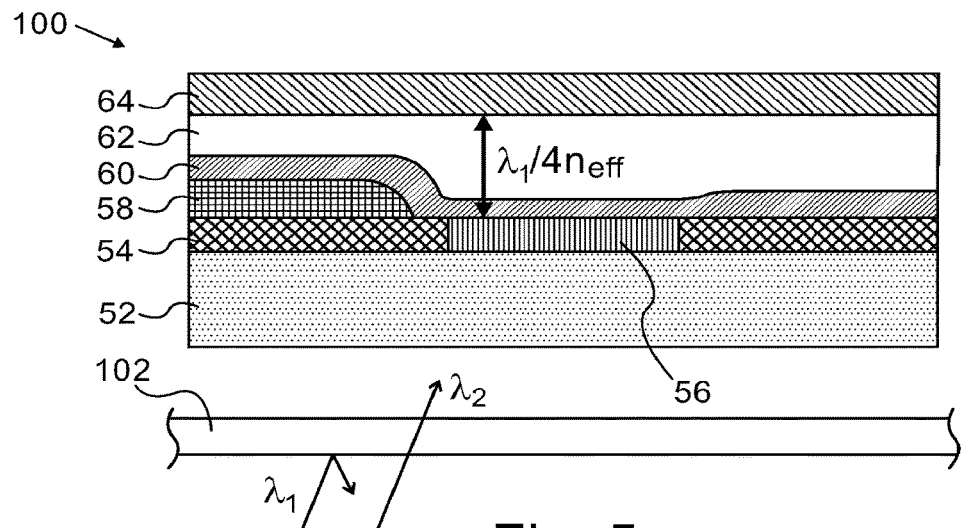
FIG. 5 is a schematic sectional illustration of a blind sensing element, in accordance with an embodiment of the present invention.

FIG. 5 is a schematic sectional illustration of a blind sensing element 100, in accordance with an embodiment of the present invention. Sensing element 100 is an example of the second approach listed above for creating a blind sensor. In element 100, first metal layer 64 (M1) is extended across the cavity behind the sensing element, at a distance equal to $\lambda_1/4n_{eff}$, such that $\lambda_1 < \lambda_2$, wherein $\lambda_2$ is the wavelength of interest, such as 9-10 μm as in the preceding examples. The effective optical path from the transistor to M1 is thus considerably less than $\lambda_2/4n_{eff}$, and sensing element 100 will therefore be blind to radiation of wavelength $\lambda_2$. At the same time, a bandpass filter 102, which is typically provided in order to prevent radiation outside the range of interest, such as outside the range of 9-10 μm, from reaching the sensing elements, blocks radiation at wavelength $\lambda_1$. Consequently, blind sensing element 100 will absorb very little radiation from the scene. This blind sensing element and the enhanced capabilities it supports can be provided at little or no added cost in terms of device fabrication and packaging.

Figure 6:
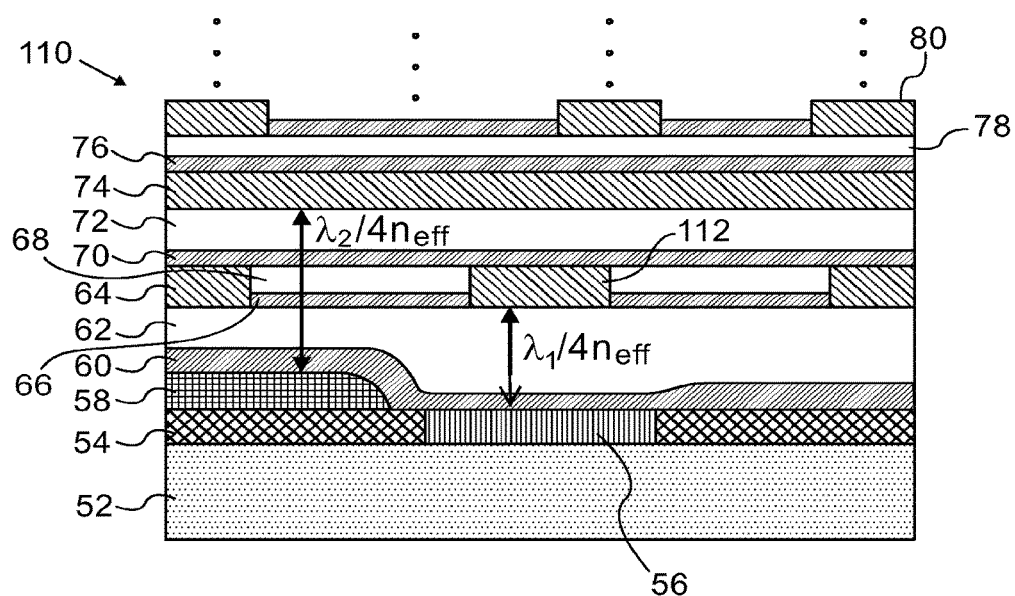
FIG. 6 is a schematic sectional illustration of a multi-band sensing element, in accordance with another embodiment of the present invention.

FIG. 6 is a schematic sectional illustration of a multi-band sensing element 110, in accordance with another embodiment of the present invention. In this case, metal layer 64 is patterned to create an additional cavity reflector 112, at a distance $\lambda_1/4n_{eff}$ from the transistor in sensing element 110. Metal layer 74 remains positioned at a distance $\lambda_2/4n_{eff}$ from the transistor, as in the preceding examples. Consequently, the cavity behind sensing element 110 has resonances at both $\lambda_1$ and $\lambda_2$, and the sensing element will thus be sensitive to both of these wavelengths (assuming neither wavelength range is filtered out of the incoming radiation). Sensing element 110 may be designed in this manner, for example, to sense radiation in both the 3-5 μm and 8-10 μm bands. Optionally, the geometry of the sensing element may be modified to have three or more resonant wavelengths. As a further option, different sensing elements in the same array may have respective reflectors at different distances, so that different sensing elements are sensitive to different wavelengths.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

We claim:

1. A sensing device, comprising an array of sensing elements, each sensing element comprising:
    a thermal infrared sensor, configured to output an electric signal in response to an intensity of infrared radiation that is incident on the sensor; and
    an individual reflector, formed integrally with the sensor at a location separated from the sensor by one quarter wave at a selected wavelength of the infrared radiation; and
    wherein at least some of the sensing elements comprise multiple individual reflectors, which are separated from the sensor by one quarter wave at multiple different, respective wavelengths.

2. The device according to claim 1, wherein the sensing element contains an open optical cavity between the sensor and the individual reflector.

3. The device according to claim 2, wherein the individual reflector is perforated by a matrix of through-holes.

4. The device according to claim 1, wherein each sensing element comprises one or more dielectric layers, which are deposited over the sensor, and wherein the individual reflector comprises a metal layer that is deposited over the one or more dielectric layers, thereby defining a dielectric optical cavity between the sensor and the individual reflector.

5. The device according to claim 1, comprising a blind sensing element, which senses only its own temperature and not the infrared radiation that is incident on the device.

6. The device according to claim 5, wherein the blind sensing element comprises a further thermal infrared sensor and a reflecting layer formed less than one quarter wave from the further thermal infrared sensor at the selected wavelength.

7. The device according to claim 1, wherein the array comprises multiple dielectric and metal layers formed on a semiconductor substrate, and wherein at least one of the metal layers is configured to serve as the individual reflector for each of the sensing elements in the array.

8. The device according to claim 7, wherein the thermal infrared sensor in each sensing element comprises a micromachined temperature-sensitive transistor.

9. The device according to claim 8, wherein the micromachined temperature-sensitive transistor is a thermally-isolated metal oxide semiconductor (TMOS) sensor.

10. The device according to claim 7, wherein the dielectric and metal layers are further formed so as to define columns between the sensing elements, wherein the columns maintain optical and thermal separation between the sensing elements.

11. A method for producing a sensing device, comprising fabricating an array of sensing elements on a semiconductor substrate, each sensing element comprising: a thermal infrared sensor, configured to output an electric signal in response to an intensity of infrared radiation that is incident on the sensor; and an individual reflector, formed integrally with the sensor at a location separated from the sensor by one quarter wave at a selected wavelength of the infrared radiation; and wherein fabricating the array comprises forming in at least some of the sensing elements multiple individual reflectors, which are separated from the sensor by one quarter wave at multiple different, respective wavelengths.

12. The method according to claim 11, wherein fabricating the array comprises depositing one or more dielectric layers over the sensor, and depositing a metal layer over the one or more dielectric layers to serve as the individual reflector, thereby defining a dielectric optical cavity between the sensor and the individual reflector.

13. The method according to claim 11, wherein fabricating the array comprises forming multiple dielectric and metal layers on the semiconductor substrate, wherein at least one of the metal layers is configured to serve as the individual reflector for each of the sensing elements in the array.

14. The method according to claim 13, wherein the thermal infrared sensor in each sensing element comprises a micro-machined temperature-sensitive transistor.

* * * * *